United States Patent
Komiak

(10) Patent No.: US 6,617,938 B1
(45) Date of Patent: Sep. 9, 2003

(54) RETURN TO ZERO AND SAMPLING PULSE GENERATING CIRCUITS AND METHOD FOR DIRECT DIGITAL UP CONVERSION

(76) Inventor: James J. Komiak, 6 Farmers Rd., Merrimack, NH (US) 03054

( * ) Notice: Subject to any disclaimer, the term of this patent is extended or adjusted under 35 U.S.C. 154(b) by 0 days.

(21) Appl. No.: 10/113,279

(22) Filed: Apr. 1, 2002

(51) Int. Cl.[7] .................................................. H03K 7/02
(52) U.S. Cl. ........................ 332/115; 332/116; 375/353
(58) Field of Search ................................ 332/106, 115, 332/116, 149, 167–171, 178; 375/268–270, 301–302, 353

(56) References Cited

U.S. PATENT DOCUMENTS 3,959,745 A * 5/1976 LaGuardia .................. 341/143

* cited by examiner

Primary Examiner—David C. Mis
(74) Attorney, Agent, or Firm—Bouque & Associates, PA

(57) ABSTRACT

Direct up-conversion of a signal is accomplished using a sampling pulse generator circuit and a gated differential amplifier, enabled by the sampling signal. When not enabled, the output of the differential amplifier is pulled to zero. The sampling pulse is generated from a base frequency sine wave which is squared with a limiting amplifier, and further passed through one or more frequency doublers producing a times two signal, a times four signal and so on. The squared base frequency and frequency doubled signals are logically ORed to produce a short duration pulse which repeats at the frequency of the base signal. The resulting output is an amplitude modulated pulse doublet time domain waveform.

27 Claims, 5 Drawing Sheets

RETURN TO ZERO AND SAMPLING PULSE GENERATING CIRCUITS AND METHOD FOR DIRECT DIGITAL UP CONVERSION

TECHNICAL FIELD

The present invention relates to signal transmission, and more particularly, relates to direct up-conversion analog signals.

BACKGROUND INFORMATION

In the field of radar, radio and other signal transmission applications, it is often desirable to up-convert a baseband signal from one frequency to a higher frequency. Typically, this has been done using multiple local oscillators with associated filters, mixers, intermediate frequency amplifiers and phase-locked loop circuitry. Such circuits consume power, are inherently lossy, and can emit spurious unwanted harmonic signals. These unwanted emissions can, with appropriate equipment, be detected and hence reduce the stealth capabilities of such applications. Additionally, a number of components associated with these local oscillators cannot readily be implemented in integrated circuits, requiring off-chip circuit elements such as crystals and inductors.

When utilizing field portable power sources, it is desirable that power consumption be minimized, and power be utilized efficiently. Reducing the circuit element count in a circuit can reduce power consumption, but utilizing traditional local oscillators and mixers for up-conversion has a practical limitation in traditional local oscillator-based designs for up conversion.

What is needed is an efficient (i.e. low circuit element count and power consumption) way to provide up-conversion, while minimizing spurious emissions to improve the stealth characteristics of the application.

SUMMARY OF THE INVENTION

The present invention addresses the problems associated with using local oscillators by performing direct up-conversion using a novel combination of analog and digital circuitry to produce a sampling pulse, which is used to control a gated differential amplifier. This results in a time domain waveform that is a pulse doublet train which is amplitude modulated by the input signal to the differential amplifier. The pulse circuit is generated by frequency doubling, amplifying and limiting (to square up the resulting signal) a base signal one or more times, and using the resulting signals (times two, times four and so forth) to produce a short duration sampling signal repeating at the frequency of the base signal.

In one aspect, the invention includes a system and method which squares an input sine wave, applies it to a frequency doubler and limiting amplifier (FDLA), and the two signals are fed to a logical NOR gate to produce a narrow sampling pulse. The sampling pulse is used to control the output of a gated differential amplifier. When the sampling pulse is asserted, the output of the gated differential amplifier tracks the input (from, in one aspect, a digital to analog converter) and when the sampling pulse is not asserted, the output of the differential amplifier is pulled to zero. In another aspect, the doubled input signal is in turn applied to a FDLA to produce a times four signal which is also input to the logical NOR gate, in which aspect the sampling pulse is repeated at the frequency of the input sine wave, but has a duration of a single half cycle of eight times the frequency of the input sine wave.

In another aspect, the invention is, at least in part, implemented as a Monolithic Microwave Integrated Circuit (MMIC), and in yet another aspect uses pseudomorphic high electron mobility transistors (PHEMT). In still another aspect, the differential amplifier is controlled by gating the biasing current to the amplifier. The output of the differential amplifier, in another aspect, is converted to unbalanced microstrip using a planar balun.

An advantage of the present invention is that it may be implemented in a single monolithic integrated circuit without the need for external local oscillators and mixers. It is also an advantage in a wideband system that eliminating the need for local oscillators reduces the potential for in-band and near in-band re-radiation. Yet another advantage is a reduced number of circuit elements which reduces cost and power consumption.

BRIEF DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENT

Direct up conversion of analog signals is of interest to radio, radar and other transmitting systems. Direct up-conversion can provide size, power, weight and cost benefits compared to analog up conversion using local oscillators and mixers. Elimination of local oscillators reduces the potential for in-band and near in-band local oscillator re-radiation, which is desirable in stealthy applications.

A direct up-conversion application can be segmented into two sections: a return to zero (RTZ) sampler and a sampling pulse generator. An implementation of a return to zero (RTZ) and sampling pulse circuit in accordance with the principles of the present invention is described below.

The RTZ uses a gated differential amplifier that tracks an input signal from an analog to digital converter at the input during a short sampling interval, and otherwise outputs zero volts.

Figure 1:
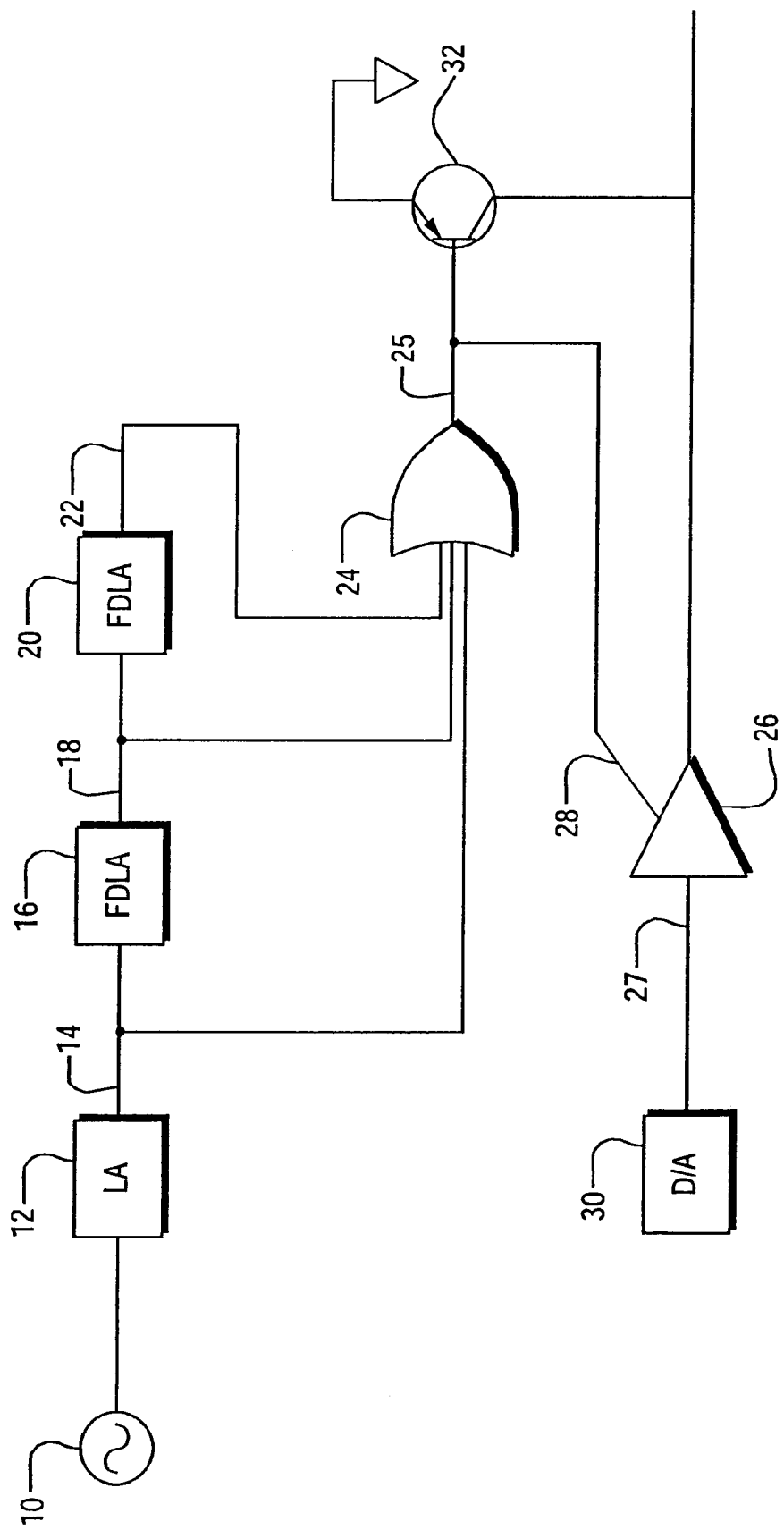
FIG. 1 is a block diagram of a return to zero (RTZ) circuit and sampling pulse generator in accordance with the present invention.

FIG. 1 shows a block diagram of an RTZ circuit and sampling pulse generator in accordance with the present invention. A sine wave input 10 is converted to a square wave by a limiting amplifier 12, producing a base pulse stream 14. The base pulse stream 14 is fed to a frequency doubler and limiting amplifier (FDLA) 16 producing a times two (×2) pulse stream 18 at twice the frequency of the first pulse stream 14. In turn, the times two pulse stream 18 is fed to a second FDLA 20 producing a times four (4×) pulse stream 22.

The three pulse streams (base 14, times two 18 and times four 22) are applied as inputs to a logical NOR circuit 24.

The result is a sampling pulse output 25 which is a narrow pulse having a pulse width of a single half cycle of the times four pulse stream 22 and a frequency rate equal to the rate of the base pulse stream 14.

It has been found to be better to derive the sampling pulse by frequency doubling rather than starting with a higher frequency and dividing down. Frequency doubling provides greater stability and repeatability.

The output 25 of the logical NOR circuit 24 is applied to a control input 28 of a gated differential amplifier 26. When the control input 28 of the gated differential amplifier 26 is enabled, it the output of the differential amplifier 26 follows the input 27. In one implementation, the input 27 is connected to the output of a digital to analog converter.

When the control input 28 of the gated differential amplifier 26 is disabled, the current source (not shown) to the gated differential amplifier 26 is disabled, and the output 34 is pulled to zero by a switch 32.

In a preferred embodiment, the RTZ and sampling pulse generator are implemented as a monolithic microwave integrated circuit (MMIC) with pseudomorphic high electron mobility transistors (PHEMT) fabricated using a 0.15 double recess fully selective (etch stop) process. This process has been found to be versatile, allowing the combination of low noise, power, passive switching and mixed signal devices on the same mask set. The use of etch stop results in good uniformity and high yield. The MMIC is implemented on a 101.6 um thick substrate with slot vias and incorporated 25 ohms/square TaN (Tantalum Nitride) resistors and 400 pF/mm$^2$ metal-insulator-metal (MIM) SiN (Silicon Nitride) capacitors.

Figure 2:
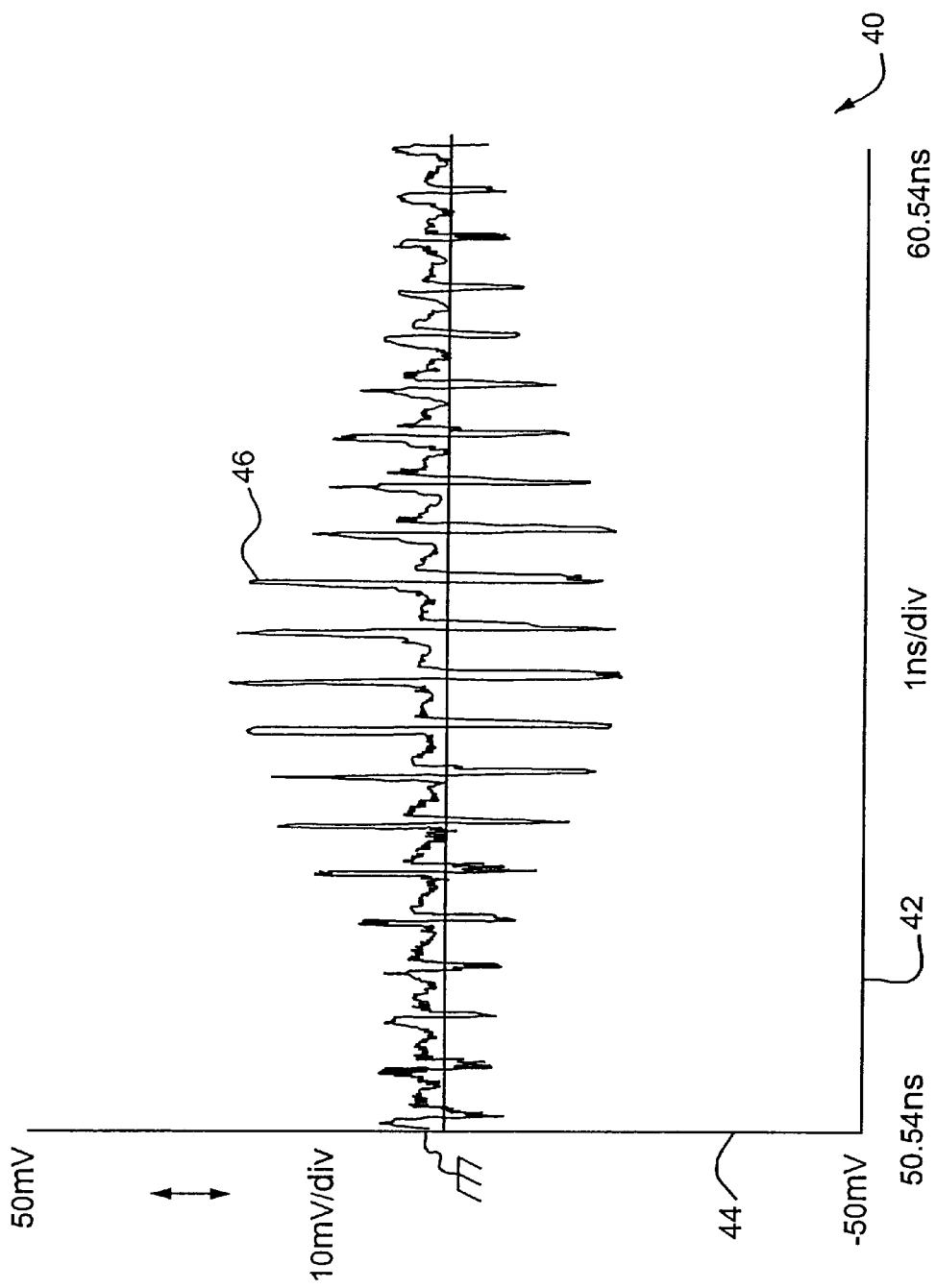
FIG. 2 is a time domain plot of a sample output waveform of a direct up conversion.

Referring to FIG. 2, a time domain plot 40 of the output 34 of an RTZ circuit fabricated according to the teachings of the present invention is shown. A 100 MHz reference signal from a digital to analog converter (not shown) was supplied to the input of the gated differential amplifier 26, and a 2 GHz sine wave (not shown) was supplied as the input 10 to the sampling pulse generator. Other frequencies could be used advantageously. The X axis 42 is 1 nanosecond per division, and the Y axis 44 is 10 mV per division. The plot 46 shows the measured amplitude modulated pulse doublet time domain waveform 46 recorded using a sampling scope.

Figure 3:
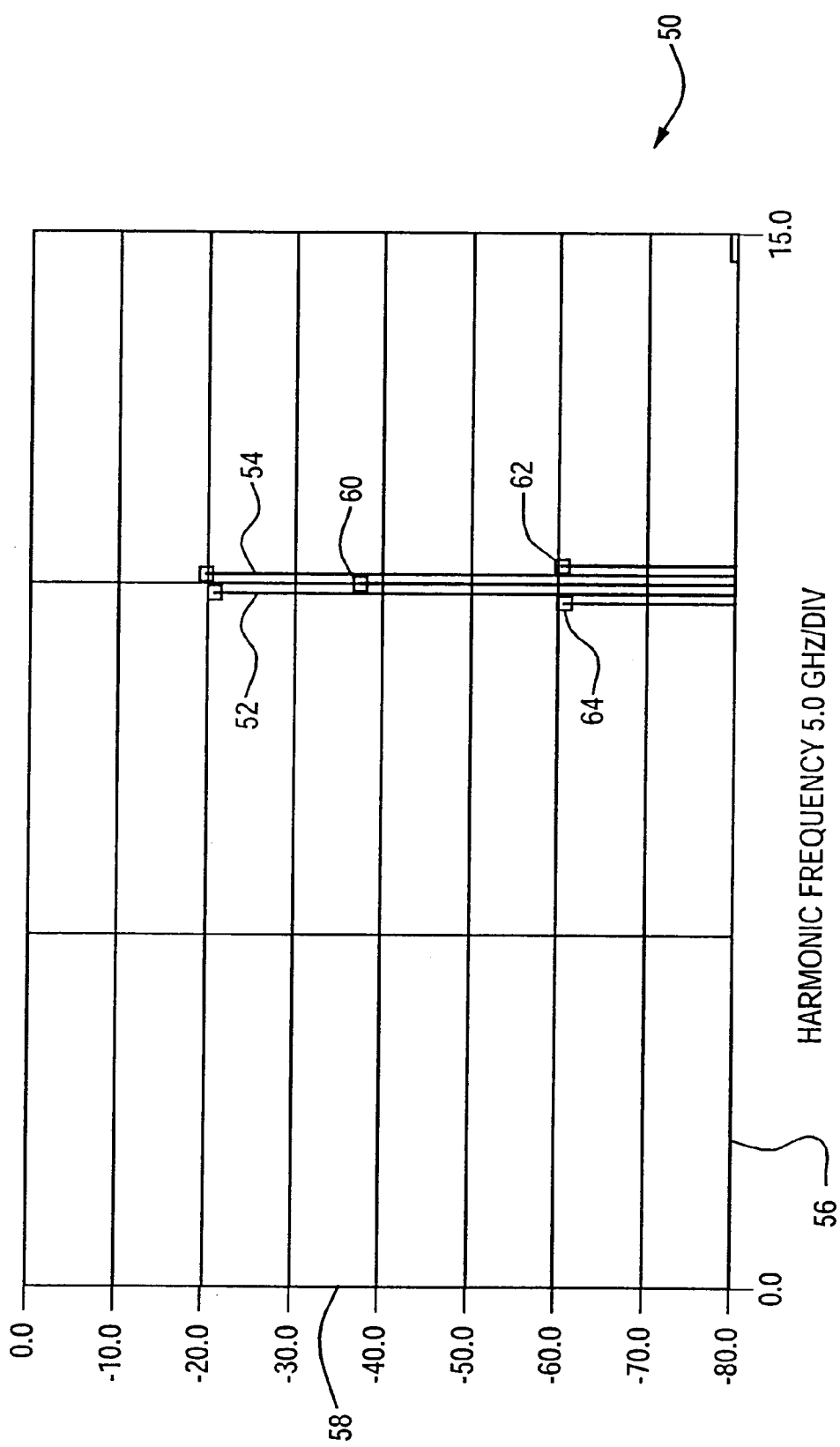
FIG. 3 is a plot of an output spectrum from a sample waveform after filtering by X-Band pre-selector filter.
Figure 4:
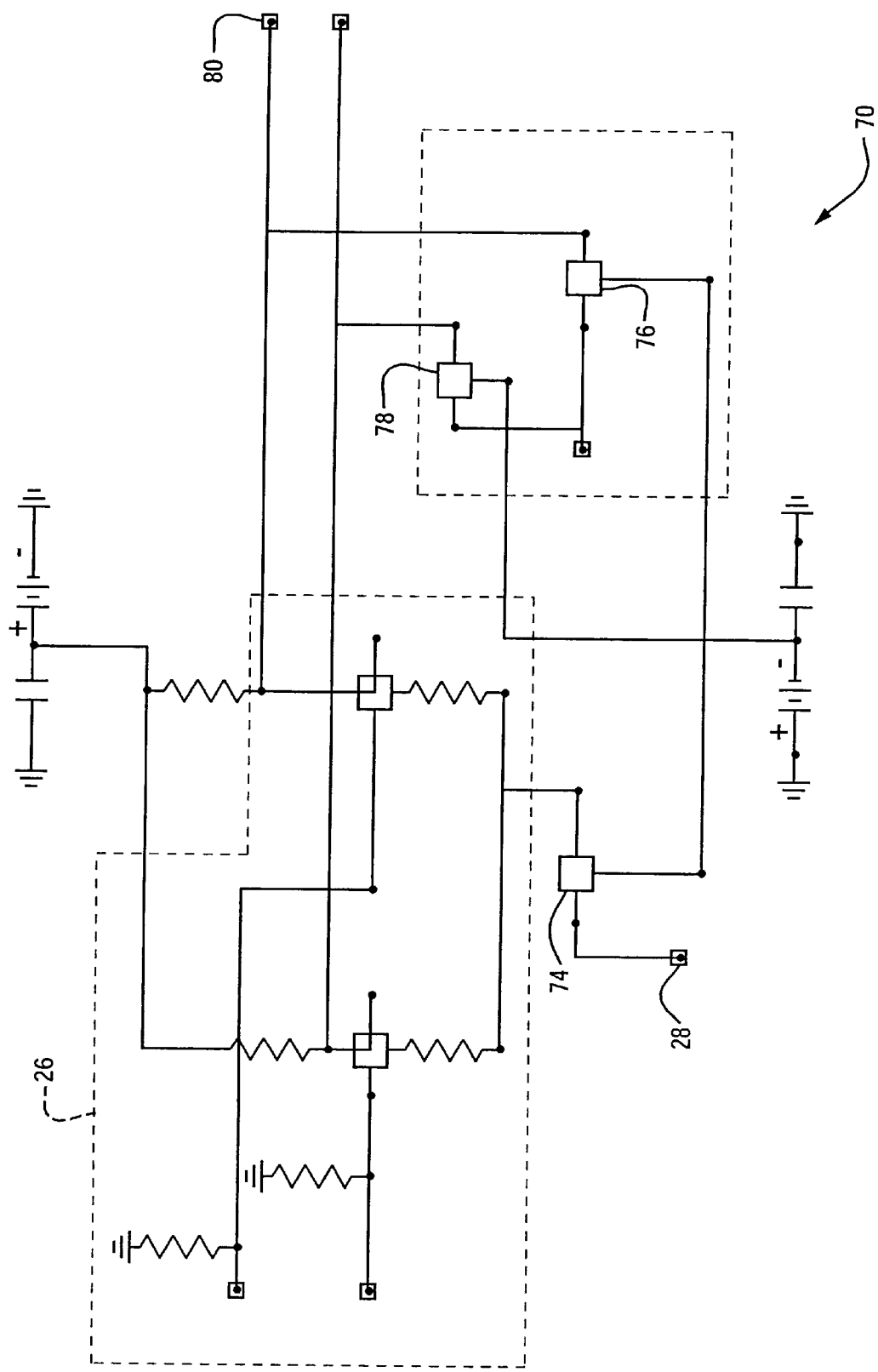
FIG. 4 is a block diagram of an implementation of an RTZ circuit in a microchip.

FIG. 3 shows the output spectrum 50 of the modulated pulse doublet waveform 46 after passing it through an X-Band pre-selector filter (not shown). The X axis 56 is harmonic frequency at 5.0 GHz per division. The Y axis 58 is ten dB per division. Two modulation sidebands 52 and 54 are clearly evident. The fifth harmonic of 2 GHz is shown suppressed by eighteen dB, and the second harmonic (62 and 64) of the modulating frequency is suppressed by forty dB FIG. 4 shows a schematic diagram of an RTZ circuit 70 as implemented in an MMIC. The gated differential amplifier 26 has a control input 28 which when asserted switches the control transistor 74 to supply current to the differential amplifier 26. When the control input 28 is not asserted, pull down transistors 76 and 78 pull the output of the differential amplifier 26 to zero. The output of the differential amplifier 26 was converted to unbalanced microstrip using a planar balun (not shown).

Figure 5:
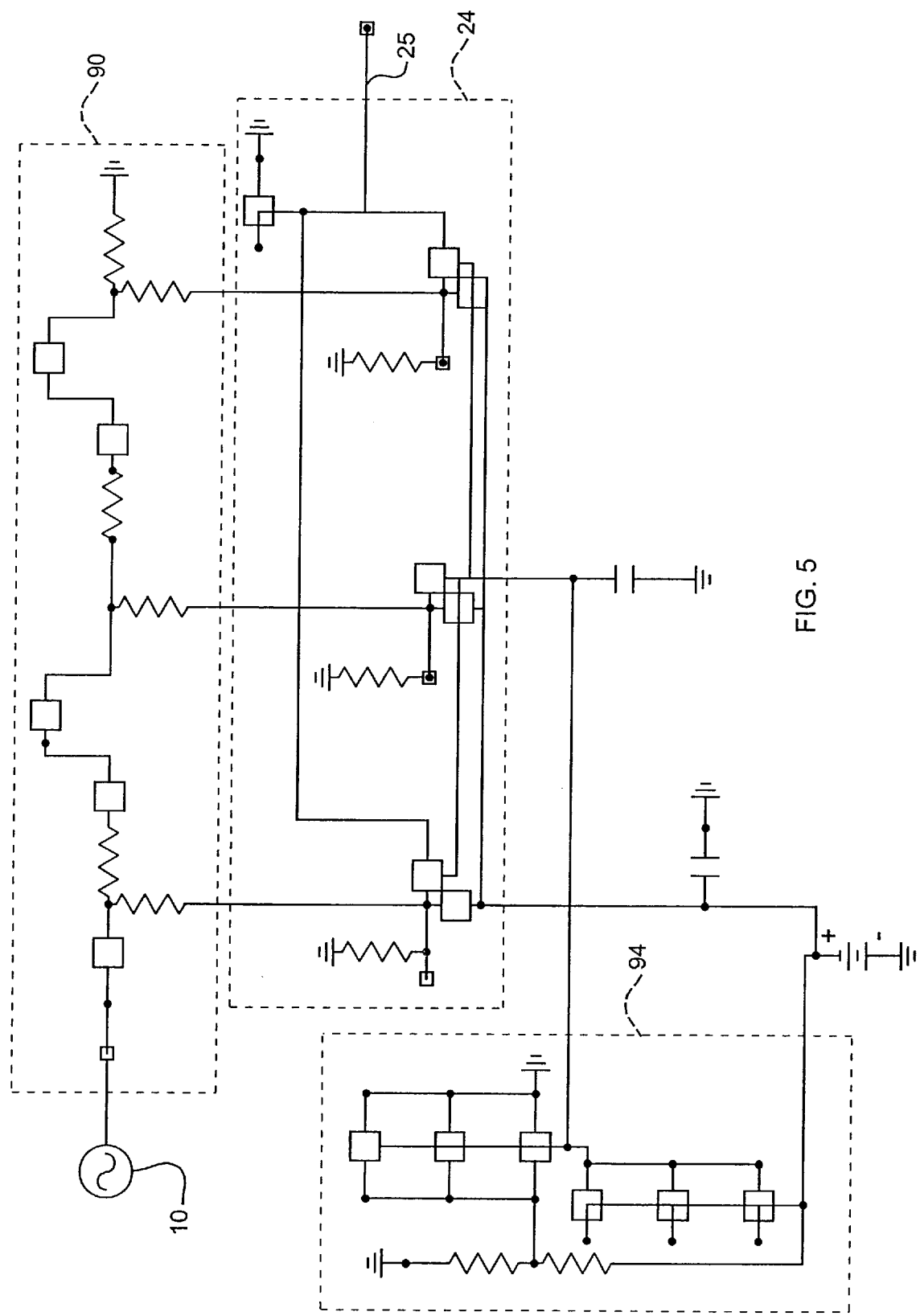
FIG. 5 is a block diagram of a clock generation circuit implementation in a microchip in accordance with one feature of the present invention.

FIG. 5 shows a schematic of a sample pulse generator circuit. A sine wave input 10 is applied to a circuit section 90 which squares the input sine wave to produce the base pulse stream 14, and produces the times two pulse stream 18 and the times four pulse stream 22. The NOR circuit 24 produces the sampling pulse 25. Circuit section 94 supplies a reference voltage to the NOR circuit.

Modifications and substitutions by one of ordinary skill in the art are considered to be within the scope of the present invention, which is not to be limited except by the following claims. For example, discrete components rather than integrated circuits could be used. Different frequencies than those shown could be used. More than two FDLA's could be used to make shorter sampling pulses.

What is claimed is:

1. A method comprising:
   in an electronic circuit, applying at least a first FDLA to a first pulse stream to derive a second pulse stream;
   deriving a sampling pulse stream from a logical NOR of at least the first and second pulse streams;
   using the sampling pulse stream to enable an output of a gated differential amplifier.

2. The method of claim 1 further comprising deriving a third pulse stream by applying a second FDLA to the second pulse stream and wherein the input to the logical NOR further comprises the third pulse stream.

3. The method of claim 1 wherein an input to the gated differential amplifier is an output from a digital to analog converter.

4. The method of claim 1 wherein the sampling pulse stream enables a pull-down circuit applied to the output of the gated differential amplifier.

5. The method of claim 1 wherein the circuit is at least partially implemented in a microchip.

6. The method of claim 5 wherein the circuit comprises at least one pseudomorphic high electron mobility transistor.

7. The method of claim 6 wherein the microchip comprises a monolithic microwave integrated circuit.

8. The method of claim 6 further comprising converting the output of the gated differential amplifier to unbalanced microstrip using a planar balun.

9. The method of claim 1 wherein the first pulse stream is a square wave derived from applying a limiting amplifier to a sine wave.

10. The method of claim 3 wherein the sampling pulse stream controls a current source biasing the differential amplifier.

11. A circuit comprising:
    at least a first pulse stream;
    at least a first FDLA receiving as an input the at least first pulse stream and an output providing a second pulse stream;
    a logical NOR circuit receiving as input the at least the first and second pulse streams and providing a sampling pulse stream as an output;
    a gated differential amplifier having the sampling pulse stream as a control input.

12. The circuit of claim 11 further comprising a second FDLA receiving as an input the second pulse stream and providing as an output a third pulse stream, and wherein the input to the logical NOR circuit further comprises the third pulse stream.

13. The circuit of claim 11 wherein an input to the gated differential amplifier is an output from a digital to analog converter.

14. The circuit of claim 11 wherein the sampling pulse stream in a first logical state enables a pull-down circuit connected to the output of the gated differential amplifier.

15. The circuit of claim 11 wherein the circuit is at least partially implemented as a microchip.

16. The circuit of claim 15 wherein the circuit comprises at least one pseudo-morphic high electron mobility transistor.

17. The circuit of claim 16 wherein the microchip comprises a monolithic microwave integrated circuit.

18. The circuit of claim 17 further comprising a balun connected to the output of the gated differential amplifier to convert the output to unbalanced microstrip.

19. The circuit of claim 11 further comprising a limiting amplifier having a sine wave as an input and the first pulse signal as an output.

20. The circuit of claim 11 wherein the sampling pulse stream controls a current source biasing the differential amplifier.

21. A system comprising:
- an electrical circuit comprising at least a first FDLA having an input and an output, further comprising a logical NOR circuit and a gated differential amplifier;
- wherein a first pulse train applied to the input of the at least first FDLA produces a second pulse train at the output of the at least first FDLA;
- and wherein at least the first and second pulse trains comprise inputs to the logical NOR circuit and wherein the output of the logical NOR circuit comprises a control signal;
- a return-to-zero circuit comprising a gated differential amplifier having an input and an output and a control input connected to the control signal, wherein the output of the gated differential amplifier follows the input of the gated differential amplifier when the control signal is in a first logical state, and wherein the output of the gated differential amplifier is pulled toward zero when the control signal is in a second logical state.

22. The system of claim 21 within the second FDLA having the second pulse stream as an input and a third pulse stream as an output, and wherein the input to the logical NOR circuit further comprises the third pulse stream.

23. The system of claim 21 wherein an input to the gated differential amplifier is an output from a digital to analog converter.

24. The system of claim 21 wherein the sampling pulse stream in a first logical state enables a pull-down circuit applied to the output of the gated differential amplifier.

25. The system of claim 21 further comprising a balun connected to the output of the gated differential amplifier to convert the output to unbalanced microstrip.

26. The system of claim 21 wherein the first pulse stream comprises a square wave derived from applying a limiting amplifier to a sine wave.

27. The system of claim 21 wherein the sampling pulse signal controls a current source biasing the differential amplifier.

* * * * *